United States Patent
Tamura et al.

(10) Patent No.: US 10,407,548 B2
(45) Date of Patent: Sep. 10, 2019

(54) POLYAMIDE COMPOSITION FOR REFLECTOR, REFLECTOR, LIGHT EMITTING DEVICE INCLUDING THE REFLECTOR, AND LIGHTING DEVICE AND IMAGE DISPLAY DEVICE EACH INCLUDING THE LIGHT EMITTING DEVICE

(71) Applicant: KURARAY CO., LTD, Kurashiki-shi (JP)

(72) Inventors: Kozo Tamura, Ibaraki (JP); Takaharu Shigematsu, Ibaraki (JP); Shimon Kanai, Ibaraki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 13/932,760

(22) Filed: Jul. 1, 2013

(65) Prior Publication Data

US 2013/0286654 A1    Oct. 31, 2013

Related U.S. Application Data

(63) Continuation of application No. 13/989,952, filed as application No. PCT/JP2012/000358 on Jan. 20, 2012.

(30) Foreign Application Priority Data

Jan. 28, 2011  (JP) ................................ 2011-017078

(51) Int. Cl.
*C08G 69/26* (2006.01)
*C08K 3/013* (2018.01)
(Continued)

(52) U.S. Cl.
CPC .......... *C08G 69/26* (2013.01); *C08G 69/265* (2013.01); *C08K 3/22* (2013.01); *F21V 7/22* (2013.01);
(Continued)

(58) Field of Classification Search
CPC ................. C08G 69/26; C08G 69/265; C08K 2003/2241; C08K 2201/014; C08K 3/013;
(Continued)

(56) References Cited

U.S. PATENT DOCUMENTS 5,670,608 A     9/1997  Oka et al.
6,156,869 A  *  12/2000 Tamura et al. ............... 528/310
(Continued)

FOREIGN PATENT DOCUMENTS

EP    2 471 868 A1    7/2012
EP    2 476 731 A1    7/2012
(Continued)

OTHER PUBLICATIONS

Machine translation of JP 2006-257314 (2006).*
(Continued)

*Primary Examiner* — John D Freeman
(74) *Attorney, Agent, or Firm* — Oblon, McClelland, Maier & Neustadt, L.L.P.

(57) ABSTRACT

The present invention provides a polyamide composition for a reflector having high heat resistance and good mechanical properties, having excellent adhesion to a sealing material for an LED package, and capable of retaining a high reflectance even after exposure to heat and light intended for the production process of the LED package and the environment in which the reflector is used in the LED package, when it is molded. The present invention is a polyamide composition for a reflector, containing: 30 mass % or more of a polyamide (A) having a melting point of 280° C. or
(Continued)

higher; and 25 mass % or more of titanium oxide (B). The total content of the polyamide (A) and the titanium oxide (B) is 75 mass % or more.

14 Claims, 2 Drawing Sheets

(51) Int. Cl.
    *C08K 3/22*     (2006.01)
    *H01L 33/60*     (2010.01)
    *F21V 7/22*     (2018.01)
    *H01L 33/48*     (2010.01)

(52) U.S. Cl.
CPC .............. *H01L 33/60* (2013.01); *C08K 3/013* (2018.01); *C08K 2003/2241* (2013.01); *C08K 2201/014* (2013.01); *H01L 33/486* (2013.01); *H01L 2224/48091* (2013.01); *H01L 2224/48247* (2013.01); *H01L 2224/49107* (2013.01); *H01L 2924/12044* (2013.01); *Y10T 428/31725* (2015.04)

(58) Field of Classification Search
CPC ............ C08K 3/22; H01L 2224/48091; H01L 2924/12044; H01L 2924/00; H01L 2924/00014; H01L 2224/48247; H01L 2224/49107; H01L 33/486; H01L 33/60; F21V 7/22; Y10T 428/31725
See application file for complete search history.

(56) References Cited

U.S. PATENT DOCUMENTS

| | | | |
|---|---|---|---|
| 7,009,029 B2 | 3/2006 | Oka et al. | |
| 8,357,450 B2 | 1/2013 | Miyoshi et al. | |
| 9,822,949 B2* | 11/2017 | Tamura | C08G 69/26 |
| 2006/0135670 A1 | 6/2006 | Richter et al. | |
| 2007/0161741 A1 | 7/2007 | Ogasawara | |
| 2009/0029138 A1* | 1/2009 | Miyoshi et al. | 428/220 |
| 2009/0134411 A1 | 5/2009 | Kitani et al. | |
| 2010/0173139 A1* | 7/2010 | Miyoshi et al. | 428/220 |
| 2010/0204391 A1 | 8/2010 | Bersted et al. | |
| 2011/0028614 A1* | 2/2011 | Shikano | C08G 69/265 524/126 |
| 2012/0165448 A1* | 6/2012 | Lee et al. | 524/236 |
| 2012/0170277 A1 | 7/2012 | Tamura et al. | |
| 2012/0228564 A1 | 9/2012 | Hashimoto et al. | |

FOREIGN PATENT DOCUMENTS

| | | | | |
|---|---|---|---|---|
| JP | 7 228689 | | 8/1995 | |
| JP | 7 228690 | | 8/1995 | |
| JP | 2002 294070 | | 10/2002 | |
| JP | 2004 75994 | | 3/2004 | |
| JP | 2005 194513 | | 7/2005 | |
| JP | 2006-002113 A | | 1/2006 | |
| JP | 2006 257314 | | 9/2006 | |
| JP | 2007-218980 A | | 8/2007 | |
| JP | 2008182172 A | * | 8/2008 | |
| JP | 2008 239908 | | 10/2008 | |
| JP | WO 2009113590 A1 | * | 9/2009 | ........... C08G 69/265 |
| JP | 2010-047741 A | | 3/2010 | |
| JP | 2010 80793 | | 4/2010 | |
| JP | 2010080793 A | * | 4/2010 | |
| JP | 2010 209247 | | 9/2010 | |
| JP | 2011 219697 | | 11/2011 | |
| JP | 4998841 B2 | | 8/2012 | |
| WO | 2007 037355 | | 4/2007 | |
| WO | 2008 149862 | | 12/2008 | |
| WO | 2011 030746 | | 3/2011 | |
| WO | 2011 027562 | | 10/2011 | |
| WO | 2012/026413 A1 | | 3/2012 | |
| WO | WO 2012/175880 A1 | | 12/2012 | |

OTHER PUBLICATIONS

Machine translation of JP 2008-182172 (2008).*
Machine translation of JP 2010-080793 (2010).*
Machine translation of JP 2007-218980 (2007).*
International Search Report dated Apr. 17, 2012 in PCT/JP12/00358 filed Jan. 20, 2012.
Extended European Search Report dated Sep. 5, 2013 in Patent Application No. 13174581.2.
Extended European Search Report dated Sep. 5, 2013 in Patent Application No. 13174567.1.
U.S. Appl. No. 13/932,809, filed Jul. 1, 2013, Tamura, et al.

* cited by examiner

POLYAMIDE COMPOSITION FOR REFLECTOR, REFLECTOR, LIGHT EMITTING DEVICE INCLUDING THE REFLECTOR, AND LIGHTING DEVICE AND IMAGE DISPLAY DEVICE EACH INCLUDING THE LIGHT EMITTING DEVICE

CROSS REFERENCE TO RELATED APPLICATIONS

The present application is a continuation of U.S. patent application Ser. No. 13/989,952, filed on May 28, 2013, the entire content of which is herein incorporated by reference.

TECHNICAL FIELD

The present invention relates to a polyamide composition for a reflector, a reflector using the composition, and a light emitting device including the reflector. The present invention also relates to a lighting device and an image display device each including the light emitting device.

BACKGROUND ART

Because of their advantages such as low power consumption and low environmental load, light emitting diodes (LEDs) have recently been used in various electrical and electronic products such as small displays of mobile communication devices including mobile phones, etc., medium and large displays of personal computers, liquid crystal TVs, etc., console panels of automobiles and interior lights for automobiles, household lights, signs and indicator lights, traffic lights, and other household appliances.

An LED is usually used as an LED package, and the LED package is mainly composed of a semiconductor element (LED) that emits light, a lead wire, a reflector serving also as a housing, and a transparent sealing material for sealing the semiconductor element. Ceramics are known as materials used for such reflectors. However, the use of ceramics for reflectors causes problems of low productivity and low initial reflectance. Heat-resistant plastics also are known as materials used for reflectors. For example, Patent Literatures 1 to 5 disclose the use of polyamide compositions containing titanium oxide as heat-resistant plastics for the reflectors.

A heat-resistant plastic reflector is required to have heat resistance because it is exposed to temperatures of 100° C. to 200° C. for several hours when a conductive adhesive or a sealing agent is thermally cured during the production of an LED package. The reflector is also required to retain a high light reflectance (in particular, a high reflectance for light with a wavelength of around 460 nm for use in a white LED), without being discolored when it is exposed to high temperatures during the production of an LED package or in the environment in which the reflector is used in the LED package. It is further required to have good mechanical properties as a reflector. It is also required to have high adhesion to the sealing material.

Thus, the heat-resistant plastic reflector is required to have various properties, and the techniques described in Cited Literatures 1 to 5 have room for improvement.

CITATION LIST

Patent Literature

Patent Literature 1: JP 2002-294070 A
Patent Literature 2: JP 2004-075994 A
Patent Literature 3: JP 2005-194513 A
Patent Literature 4: JP 2006-257314 A
Patent Literature 5: WO 2007/037355 A1

SUMMARY OF INVENTION

Technical Problem

In view of the above, it is an object of the present invention to provide a polyamide composition for a reflector having high heat resistance and good mechanical properties, having excellent adhesion to a sealing material for an LED package, and capable of retaining a high reflectance even after exposure to heat and light intended for the production process of the LED package and the environment in which the reflector is used in the LED package, when it is molded, and to provide a reflector made of the composition and a light emitting device including the reflector. It is another object of the present invention to provide a lighting device and an image display device each including the light emitting device.

Solution to Problem

As a result of intensive studies, the present inventors have found that a composition containing a specific polyamide resin and a high content of titanium oxide can achieve the above objects, and accomplished the present invention.

The present invention is a polyamide composition for a reflector, containing 30 mass % or more of a polyamide (A) having a melting point of 280° C. or higher; and 25 mass % or more of titanium oxide (B). The total content of the polyamide (A) and the titanium oxide (B) is 75 mass % or more.

The present invention is also a reflector for an LED, including the polyamide composition for a reflector.

The present invention is also a light emitting device including the reflector for an LED.

The present invention is also a lighting device including the light emitting device.

The present invention is also an image display device including the light emitting device.

Advantageous Effects of Invention

A reflector obtained by molding the polyamide composition for a reflector according to the present invention has good mechanical properties and high heat resistance. The reflector has excellent adhesion to a sealing material for an LED package. In addition, this reflector retains a high reflectance (in particular, a high reflectance for light with a wavelength of around 460 nm) even after exposure to heat and light intended for the production process of the LED package and the environment in which the reflector is used in the LED package. Therefore, a light emitting device including this reflector, and a lighting device and an image display device each including this light emitting device have longer lives.

DESCRIPTION OF EMBODIMENTS

Figure 1:
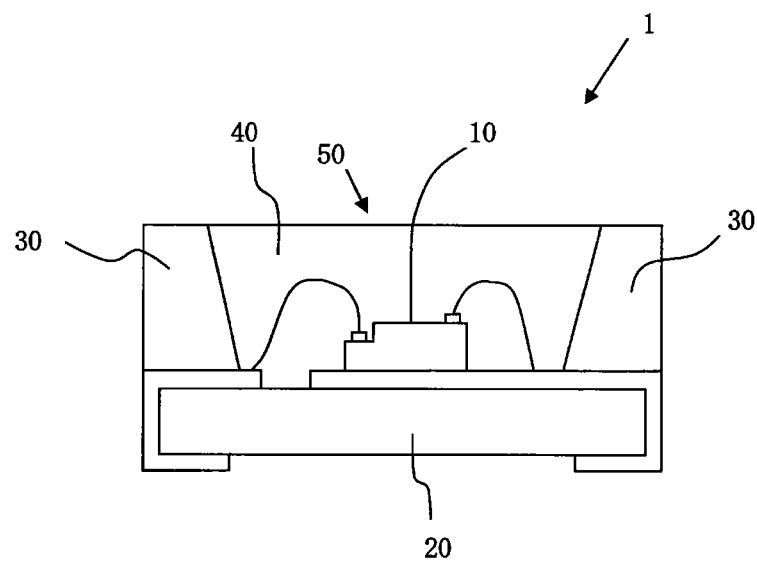
FIG. 1 is a diagram showing schematically the configuration of a light emitting device 1 according to the present invention.

The polyamide composition for a reflector according to the present invention contains 30 mass % or more of a polyamide (A) having a melting point of 280° C. or higher; and 25 mass % or more of titanium oxide (B). The total content of the polyamide (A) and the titanium oxide (B) is 75 mass % or more. The polyamide composition for a reflector according to the present invention can further contain a reinforcement material (C), and magnesium oxide and/or magnesium hydroxide, as needed.

In the present invention, the melting point of the polyamide (A) is 280° C. or higher from the viewpoint of heat resistance of the resulting reflector. The content of the polyamide (A) used in the present invention is 30 mass % or more, preferably 35 mass % or more, of the total mass of the polyamide composition for a reflector according to the present invention. When the content of the polyamide (A) is less than 30 mass %, the resulting polyamide composition has various problems such as difficulty in molding the composition into a reflector, a decrease in the adhesion of the resulting reflector to a sealing material for an LED package, and a decrease in the mechanical properties, in particular, the toughness of the reflector.

The polyamide (A) used in the present invention contains dicarboxylic acid units and diamine units. In one preferred embodiment of the present invention, the dicarboxylic acid units of the polyamide (A) contain 50 mol % or more of terephthalic acid units (hereinafter, a polyamide (A) containing 50 mol % or more of terephthalic acid units as dicarboxylic acid units is referred to as a polyamide (a-1)). In another preferred embodiment of the present invention, the dicarboxylic acid units of the polyamide (A) contain more than 50 mol % of 1,4-cyclohexanedicarboxylic acid units (hereinafter, a polyamide (A) containing more than 50 mol % of 1,4-cyclohexanedicarboxylic acid units as dicarboxylic acid units is referred to as a polyamide (a-2)).

In the polyamide (a-1), the dicarboxylic acid units contain 50 mol % or more of, preferably 60 mol % or more of, and further preferably 70 mol % or more of terephthalic acid units, because the resulting reflector has excellent heat resistance. The polyamide (a-1) can contain other dicarboxylic acid units besides terephthalic acid units as long as the effects of the present invention are not impaired. Examples of the other dicarboxylic acid units besides terephthalic acid units include units derived from aliphatic dicarboxylic acids such as malonic acid, succinic acid, glutaric acid, adipic acid, pimelic acid, suberic acid, azelaic acid, sebacic acid, undecanedicarboxylic acid, dodecanedicarboxylic acid, dimethylmalonic acid, 3,3-diethylsuccinic acid, 2,2-dimethylglutaric acid, 2-methyladipic acid and trimethyladipic acid; alicyclic dicarboxylic acids such as 1,3-cyclopentanedicarboxylic acid, 1,3-cyclohexanedicarboxylic acid, 1,4-cyclohexanedicarboxylic acid, cycloheptanedicarboxylic acid, cyclooctanedicarboxylic acid and cyclodecanedicarboxylic acid; and aromatic dicarboxylic acids such as isophthalic acid, 1,4-naphthalenedicarboxylic acid, 2,6-naphthalenedicarboxylic acid, 2,7-naphthalenedicarboxylic acid, diphenic acid, 4,4'-biphenyldicarboxylic acid, diphenylmethane-4,4'-dicarboxylic acid and diphenylsulfone-4,4'-dicarboxylic acid. One or a plurality of these units may be used. Furthermore, the polyamide (a-1) can contain units derived from polyvalent (trivalent or more) carboxylic acids, such as trimellitic acid, trimesic acid and pyromellitic acid as long as the above-mentioned properties of the polyamide composition according to the present invention are not impaired.

In the polyamide (a-2), the dicarboxylic acid units contain more than 50 mol % of, preferably 60 mol % or more of, and further preferably 80 mol % or more of 1,4-cyclohexanedicarboxylic acid units because the resulting reflector has excellent heat resistance. The cis:trans ratio of the 1,4-cyclohexanedicarboxylic acid may be in any range. The polyamide (a-2) can contain other dicarboxylic acid units besides 1,4-cyclohexanedicarboxylic acid units as long as the effects of the present invention are not impaired. Examples of the other dicarboxylic acid units besides 1,4-cyclohexanedicarboxylic acid units include units derived from aliphatic dicarboxylic acids such as malonic acid, succinic acid, glutaric acid, adipic acid, pimelic acid, suberic acid, azelaic acid, sebacic acid, undecanedicarboxylic acid, dodecanedicarboxylic acid, dimethylmalonic acid, 3,3-diethylsuccinic acid, 2,2-dimethylglutaric acid, 2-methyladipic acid and trimethyladipic acid; alicyclic dicarboxylic acids such as 1,3-cyclopentanedicarboxylic acid, 1,3-cyclohexanedicarboxylic acid, cycloheptanedicarboxylic acid, cyclooctanedicarboxylic acid and cyclodecanedicarboxylic acid; and aromatic dicarboxylic acids such as terephthalic acid, isophthalic acid, 1,4-naphthalenedicarboxylic acid, 2,6-naphthalenedicarboxylic acid, 2,7-naphthalenedicarboxylic acid, diphenic acid, 4,4'-biphenyldicarboxylic acid, diphenylmethane-4,4'-dicarboxylic acid and diphenylsulfone-4,4'-dicarboxylic acid. One or a plurality of these units may be used. Furthermore, the polyamide (a-2) can contain units derived from polyvalent (trivalent or more) carboxylic acids, such as trimellitic acid, trimesic acid and pyromellitic acid as long as the above-mentioned properties of the polyamide composition according to the present invention are not impaired.

The diamine units constituting the polyamide (A) contain preferably 50 mol % or more of, more preferably 60 to 100 mol % of, further preferably 70 to 100 mol % of, and most preferably 90 to 100 mol % of aliphatic diamine units having 4 to 18 carbon atoms. When the content of the aliphatic diamine units having 4 to 18 carbon atoms is 50 mol % or more, the composition has particularly excellent moldability and the resulting reflector has particularly excellent heat resistance.

Examples of the aliphatic diamine units having 4 to 18 carbon atoms include units derived from linear aliphatic diamines such as 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine and 1,12-dodecanediamine; and branched aliphatic diamines such as 1-butyl-1,2-ethanediamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine, 2,3-dimethyl-1,4-butanediamine, 2-methyl-1,5-pentanediamine, 3-methyl-1,5-pentanediamine, 2,5-dimethyl-1,6-hexanediamine, 2,4-dimethyl-1,6-hexanediamine, 3,3-dimethyl-1,6-hexanediamine, 2,2-dimethyl-1,6-hexanediamine, 2,2,4-trimethyl-1,6-hexanediamine, 2,4,4-trimethyl-1,6-hexanediamine, 2,4-diethyl-1,6-hexanediamine, 2,2-dimethyl-1,7-heptanediamine, 2,3-dimethyl-1,7-heptanediamine, 2,4-dimethyl-1,7-heptanediamine, 2,5-dimethyl-1,7-heptanediamine, 2-methyl-1,8-octanediamine, 3-methyl-1,8-octanediamine, 4-methyl-1,8-octanediamine, 1,3-dimethyl-1,8-octanediamine, 1,4-dimethyl-1,8-octanediamine, 2,4-dimethyl-1,8-octanediamine, 3,4-dimethyl-1, 8-octanediamine, 4,5-dimethyl-1,8-octanediamine, 2,2-dimethyl-1,8-octanediamine, 3,3-dimethyl-1,8-octanediamine, 4,4-dimethyl-1,8-octanediamine and 5-methyl-1,9-nonanediamine. The diamine units constituting the polyamide (A) may contain one or a plurality of these.

From the viewpoint of obtaining a pellet that allows a reflector to have various excellent physical properties such as heat resistance and low water absorbency and obtaining a reflector having various excellent physical properties such as heat resistance and low water absorbency, it is preferable that the aliphatic diamine units having 4 to 18 carbon atoms are units derived from at least one selected from the group consisting of 1,4-butanediamine, 1,6-hexanediamine, 2-methyl-1,5-pentanediamine, 1,8-octanediamine, 2-methyl-1,8-octanediamine, 1,9-nonanediamine, 1,10-decanediamine, 1,11-undecanediamine and 1,12-dodecanediamine. More preferably, the diamine units are 1,9-nonanediamine units and/or 2-methyl-1,8-octanediamine units.

The above-mentioned diamine units may contain other diamine units besides the aliphatic diamine units having 4 to 18 carbon atoms. Examples of the other diamine units include units derived from aliphatic diamines such as ethylenediamine, 1,2-propanediamine and 1,3-propanediamine; alicyclic diamines such as cyclohexanediamine, methylcyclohexanediamine, isophoronediamine, norbornane dimethylamine and tricyclodecane dimethylamine; and aromatic diamines such as p-phenylenediamine, m-phenylenediamine, p-xylylenediamine, m-xylylenediamine, 4,4'-diaminodiphenylmethane, 4,4'-diaminodiphenylsulfone and 4,4'-diaminodiphenylether. The above-mentioned diamine units may contain one or a plurality of these. Preferably, the content of these other diamine units in the diamine units is 40 mol % or less, more preferably 25 mol % or less, and further preferably 10 mol % or less.

The polyamide (A) may contain aminocarboxylic acid units. Examples of the aminocarboxylic acid units include units derived from lactams such as caprolactam and lauryllactam; and aminocarboxylic acids such as 11-aminoundecanoic acid and 12-aminododecanoic acid. Preferably, the content of the aminocarboxylic acid units in the polyamide (A) is 40 mol % or less, and more preferably 20 mol % or less, with respect to 100 mol %, in total, of the dicarboxylic acid units and the diamine units in the polyamide (A). In addition, polyamide 46 also can be used as the polyamide (A).

The polyamide (A) used in the present invention may contain units derived from an end-capping agent. Preferably, the content of the units derived from an end-capping agent is 1 to 10 mol %, and more preferably 3.5 to 8.5 mol %, with respect to the diamine units. When the content of the units derived from an end-capping agent falls within the above-mentioned ranges, the polyamide composition has excellent moldability and the resulting reflector has more excellent light resistance and heat resistance.

In order to set the content of the units derived from an end-capping agent to fall within the desired ranges, the end-capping agent is added so as to fall within the desired ranges with respect to the diamine when preparing a raw material to be polymerized. Taking into account that a monomer component is volatilized during the polymerization, it is desirable to fine tune the amount of the end-capping agent when preparing the raw material to be polymerized so as to introduce a desired amount of the units derived from the end-capping agent into the resulting resin.

As the method for determining the amount of the units derived from an end-capping agent in the polyamide (A), there can be mentioned, for example: a method in which, as disclosed in JP 07 (1995)-228690 A, the viscosity of the solution is measured so that the total amount of terminal groups is calculated from the relationship between this viscosity and the number-average molecular weight, and the amounts of amino groups and carboxyl groups determined by titration are subtracted from the total amount of terminal groups; and a method in which the amount of the units derived from an end-capping agent is determined, by $^1$H-NMR, based on the integral values of signals corresponding respectively to the diamine units and the units derived from the end-capping agent.

As the end-capping agent, a monofunctional compound reactive with a terminal amino group or a terminal carboxyl group can be used. Specifically, examples thereof include monocarboxylic acids, acid anhydrides, monoisocyanates, mono-acid halides, monoesters, monoalcohols and monoamines. From the viewpoints of reactivity, the stability of the capped end and the like, the monocarboxylic acids are preferred as the end-capping agent for a terminal amino group, whereas the monoamines are preferred as the end-capping agent for a terminal carboxyl group. Moreover, from the viewpoints of ease of handling, for example, the monocarboxylic acids are more preferred as the end-capping agent.

The monocarboxylic acids used as the end-capping agent are not particularly limited as long as they are reactive with an amino group. Examples thereof include: aliphatic monocarboxylic acids such as acetic acid, propionic acid, butanoic acid, valeric acid, caproic acid, caprylic acid, lauric acid, tridecanoic acid, myristic acid, palmitic acid, stearic acid, pivalic acid and isobutyric acid; alicyclic monocarboxylic acids such as cyclopentane carboxylic acid and cyclohexane carboxylic acid; aromatic monocarboxylic acids such as benzoic acid, toluic acid, α-naphthalenecarboxylic acid, β-naphthalenecarboxylic acid, methylnaphthalenecarboxylic acid and phenylacetic acid; and an arbitrary mixture of these. Particularly, acetic acid, propionic acid, butanoic acid, valeric acid, caproic acid, caprylic acid, lauric acid, tridecanoic acid, myristic acid, palmitic acid, stearic acid and benzoic acid are preferred from the viewpoints of reactivity, the stability of the capped end, price, and the like.

The monoamines used as the end-capping agent are not particularly limited as long as they are reactive with a carboxyl group. Examples thereof include aliphatic monoamines such as methylamine, ethylamine, propylamine, butylamine, hexylamine, octylamine, decylamine, stearylamine, dimethylamine, diethylamine, dipropylamine and dibutylamine; alicyclic monoamines such as cyclohexylamine and dicyclohexylamine; aromatic monoamines such as aniline, toluidine, diphenylamine and naphthylamine; and an arbitrary mixture of these. Particularly, butylamine, hexylamine, octylamine, decylamine, stearylamine, cyclohexylamine and aniline are preferred from the viewpoints of reactivity, high boiling point, the stability of the capped end, price, and the like.

The polyamide (A) used in the present invention can be produced by an arbitrary method known as a method for producing crystalline polyamide. For example, it can be produced by a method such as a solution polymerization method or an interfacial polymerization method that uses acid chloride and diamine as source materials, or a melt polymerization method, a solid-phase polymerization method or a melt extrusion polymerization method that uses dicarboxylic acid and diamine as source materials.

The polyamide (A) can be produced as follows, for example. First, diamine, dicarboxylic acid and, as needed, a catalyst and an end-capping agent are mixed together at one time to produce a nylon salt. Then, the mixture is thermally polymerized at a temperature of 200 to 250° C. to form a prepolymer. The prepolymer is further subjected to solid-phase polymerization, or is polymerized using a melt extruder. In the case where the final step of polymerization is performed by the solid-phase polymerization, it preferably is performed under reduced pressure or under flow of an inert gas. A polymerization temperature of 200 to 280° C. provides a high polymerization rate and excellent productivity and can suppress effectively the coloring and gelling of the polyamide (A). In the case where the final step of polymerization is performed by a melt extruder, the polymerization temperature preferably is 370° C. or lower. Polymerization under such conditions causes almost no decomposition of the polyamide (A), resulting in the polyamide (A) that suffers less degradation.

Examples of the catalyst that can be used when producing the polyamide (A) include phosphoric acid, phosphorous acid and hypophosphorous acid, and salts and esters of these. Examples of the salts and esters include: salts of phosphoric acid, phosphorous acid and hypophosphorous acid with metal such as potassium, sodium, magnesium, vanadium, calcium, zinc, cobalt, manganese, tin, tungsten, germanium, titanium and antimony; ammonium salts of phosphoric acid, phosphorous acid and hypophosphorous acid; and ethyl ester, isopropyl ester, butyl ester, hexyl ester, isodecyl ester, octadecyl ester, decyl ester, stearyl ester and phenyl ester of phosphoric acid, phosphorous acid and hypophosphorous acid.

In order to obtain the polyamide composition according to the present invention, it is preferable to use 50 mass % or more of the polyamide (A) in the form of solids having a particle diameter in a range of 1 mm or less. In this case, the content of the titanium oxide (B) can be easily increased to 25 mass % or more, and a composition in which the components are homogeneously mixed can be easily obtained even if the content of the titanium oxide (B) is high. The particle diameter of the polyamide (A) can be determined by a sieving method. In order to obtain the polyamide (A) in the form of solids having a particle diameter in a range of 1 mm or less, it is possible to use, as a main material for solid-phase polymerization, crushed prepolymer of the polyamide (A) passing through a sieve with a mesh size of 710 μm.

The polyamide composition according to the present invention contains 25 mass % or more of, preferably 30 mass % or more of the titanium oxide (B), with respect to the total mass of the polyamide composition for a reflector according to the present invention. When the polyamide composition contains 25 mass % or more of the titanium oxide (B), the resulting reflector can retain a high reflectance even after exposure to heat and light, and have high thermal conductivity and high heat resistance. Moreover, in this case, even if the content of the polyamide (A) is relatively low, the resulting reflector can have high adhesion to a sealing material for an LED package.

Examples of the titanium oxide (B) include titanium oxide (TiO), titanium trioxide ($Ti_2O_3$) and titanium dioxide ($TiO_2$). Any of these may be used, but the titanium dioxide is preferred. As the titanium dioxide, titanium dioxide with a rutile-type or anatase-type crystal structure is preferred, and titanium dioxide with a rutile-type crystal structure is more preferred.

The shape of the titanium oxide (B) is not particularly limited. Preferably, the titanium oxide (B) has an irregular shape. When the irregular-shaped titanium oxide (B) is used, the dimensional change of the resulting reflector and the anisotropy of the dimensional change thereof are small. As a result, the effect of reducing defects such as detachment of the reflector from the sealing agent can be obtained.

Too small and too large average particle diameters of the titanium oxide (B) may lower the light reflectance. Thus, the average particle diameter of the titanium oxide (B) preferably is 0.1 to 0.5 μm, more preferably 0.15 to 0.4 μm, and particularly preferably 0.2 to 0.3 μm. Here, it is possible to use titanium oxide particles obtained by crushing appropriately bulk titanium oxide or titanium oxide particles with a large average particle diameter, and classifying the resultant with a sieve or the like as needed so as to achieve the average particle diameter as mentioned above.

In order to improve the dispersibility of the titanium oxide (B) in the composition, surface-treated titanium oxide may be used as the titanium oxide (B). Example of the surface treatment agent include metal oxides such as silica, alumina, zirconia, tin oxide, antimony oxide and zinc oxide; organosilicon compounds such as a silane coupling agent and silicone; organotitanium compounds such as a titanium coupling agent; and organic substances such as an organic acid and a polyol.

The polyamide composition according to the present invention contains, in total, 75 mass % or more, and preferably 80 mass % or more of the polyamide (A) having a melting point of 280° C. or higher and the titanium oxide (B). When this total content range of the polyamide (A) and the titanium oxide (B) in the polyamide composition is employed, a reflector obtained by molding the composition retains a high reflectance even after exposure to heat and light intended for the production process of the LED package and the environment in which the reflector is used in the LED package, and has good mechanical properties and high heat resistance. In addition, since the polyamide composition according to the present invention contains a large amount of titanium oxide, its thermal conductivity is increased, and thus an increase in the temperature of an LED element and a reflector in the environment in which they are used can be suppressed. As a result, the LED element can have a longer life than conventional ones.

The polyamide composition for a reflector according to the present invention may contain a reinforcement material (C), as needed. As the reinforcement material (C), reinforcement materials in various forms, such as fibrous, platy, acicular, powdery and cloth forms, can be used. Specifically, there can be mentioned, for example: fibrous fillers such as glass fiber, carbon fiber, aramid fiber, liquid crystal polymer (LCP) fiber and metal fiber; platy fillers such as mica and talc; acicular fillers such as potassium titanate whisker, aluminum borate whisker, calcium carbonate whisker, magnesium sulfate whisker, wollastonite, sepiolite, xonotlite, and zinc oxide whisker; and powdery fillers such as silica, alumina, barium carbonate, magnesium carbonate, aluminum nitride, boron nitride, potassium titanate, aluminum silicate (kaolin, clay, pyrophyllite and bentonite), calcium silicate, magnesium silicate (attapulgite), aluminum borate, calcium sulfate, barium sulphate, magnesium sulfate, asbestos, glass bead, carbon black, graphite, carbon nanotube, silicon carbide, sericite, hydrotalcite, molybdenum disulfide, phenol resin particles, crosslinked styrene resin particles and crosslinked acrylic resin particles. These reinforcement materials may be used independently, or a plurality of these may be used in combination. The surfaces of these reinforcement materials (C) may be subjected to a surface treatment using a silane coupling agent, a titanium coupling agent, a polymer compound, such as an acrylic resin, a urethane resin and an epoxy resin, or other low molecular compounds in order to enhance the dispersibility of the reinforcement materials (C) into the polyamide (A) or enhance the adhesion of the reinforcement materials (C) to the polyamide (A).

Among the above-mentioned reinforcement materials (C), the fibrous filler and/or the acicular filler are preferred because they are low cost materials and make it possible to obtain molded products having high mechanical strength. As the reinforcement material (C), it is preferable to use the glass fiber from the viewpoints of high strength and low cost, whereas it is preferable to use the acicular filler from the viewpoint of obtaining molded products having high surface smoothness. Particularly, from the viewpoint of keeping the degree of whiteness, it is possible to use preferably at least one material selected from the group consisting of glass fiber, wollastonite, potassium titanate whisker, calcium carbonate whisker and aluminum borate whisker. More preferably, the glass fiber and/or the wollastonite are used.

In the case where the polyamide composition for a reflector according to the present invention contains the reinforcement material (C), the content thereof preferably is 15 mass % or less, and more preferably 10 mass % or less, with respect to the total mass of the polyamide composition from the viewpoint of increasing the moldability and mechanical properties appropriately.

The polyamide composition for a reflector according to the present invention may further contain a light stabilizer in order to prevent discoloration and suppress a decrease in light reflectance. Examples of the light stabilizer include compounds having an effect of absorbing ultraviolet rays, such as a benzophenone compound, a salicylate compound, a benzotriazol compound, an acrylonitrile compound and other conjugated compounds, and compounds having radical trapping capability, such as a hindered amine compound. Particularly, compounds having amide bonds in their molecules are preferred because they have high affinity with the polyamide (A) and excellent heat resistance. It is preferable to use the compound having the effect of absorbing ultraviolet rays in combination with the compound having the radical trapping capability because a higher stabilization effect is obtained.

In the case where the polyamide composition for a reflector according to the present invention contains the light stabilizer, the content thereof preferably is 2 mass % or less, and more preferably 0.05 to 2 mass %, with respect to the total mass of the polyamide composition, taking into account the effects of preventing the discoloration of the polyamide composition for a reflector according to the present invention and suppressing a decrease in light reflectance, and from the viewpoint of preventing the production cost from increasing excessively. Two or more of these light stabilizers can be used in combination as well.

The polyamide composition for a reflector according to the present invention may contain magnesium oxide and/or magnesium hydroxide. Thereby, it is possible to suppress the discoloration, such as yellowing, and the decrease in the degree of whiteness, particularly when the reflector is subjected to a long-time heating treatment.

The average particle diameter of the magnesium oxide and/or the magnesium hydroxide is not particularly limited. From the viewpoint of improving various physical properties, it preferably is 0.05 to 10 μm, and more preferably 0.1 to 5 μm. In order to enhance the adhesion to the polyamide (A) and the dispersibility, surface-treated magnesium oxide and/or surface-treated magnesium hydroxide may be used as the magnesium oxide and/or the magnesium hydroxide.

Examples of the surface treatment agent include organosilicon compounds such as a silane coupling agent like an aminosilane coupling agent or an epoxysilane coupling agent, and silicone; organotitanium compounds such as a titanium coupling agent; and organic substances such as an organic acid and a polyol.

In the case where the polyamide composition for a reflector according to the present invention contains the magnesium oxide and/or the magnesium hydroxide, the content thereof preferably is 0.5 to 10 mass %, and further preferably 1 to 5 mass %, with respect to the total mass of the polyamide composition for a reflector according to the present invention. A content of less than 0.5 mass % may decrease the effect of suppressing the discoloration after the heat treatment. A content exceeding 10 mass % may lower the moldability.

The polyamide composition for a reflector according to the present invention may further contain other components, for example: a colorant such as nigrosine, or another organic or inorganic colorant; a thermostabilizer such as phosphorous acid, phosphoric acid, phosphonous acid, or an ester of these; an antioxidant such as a hindered phenol antioxidant, a thio antioxidant or a phosphorus antioxidant; an antistatic agent; a nucleating agent; a plasticizer; a wax such as a polyolefin wax or a higher fatty acid ester; a mold release agent such as silicone oil; and a lubricant. In the case where the polyamide composition for a reflector according to the present invention contains the other components, the content thereof preferably is 5 mass % or less.

The polyamide composition for a reflector according to the present invention can be prepared by blending the above-mentioned constituting components in accordance with a known method. Examples of the method include a method in which the constituting components are added during the polycondensation reaction of the polyamide (A), a method in which the polyamide (A) and the other components are dry-blended, and a method in which the constituting components are melt-kneaded by an extruder. Among these, the method in which the constituting components are melt-kneaded by an extruder is preferred because it is easy to operate and provides a uniform composition. Preferably, the extruder used in this method is a twin screw type, and the melt-kneading temperature is in the range from a temperature 5° C. higher than the melting point of the polyamide (A) to a temperature of 370° C.

The polyamide composition for a reflector according to the present invention has good moldability, and the polyamide composition for a reflector according to the present invention can be molded into a reflector by a molding method, such as injection molding, extrusion molding, press molding, blow molding, calender molding or casting, that is usually used for thermoplastic resin compositions. A combined method of these molding methods can be used as well. Particularly, the injection molding is preferred in terms of ease of molding, mass productivity, cost, etc. Moreover, it also is possible to mold the polyamide composition for a reflector according to the present invention with another polymer by composite molding. Furthermore, it also is possible to mold the polyamide composition for a reflector according to the present invention with a molded metal product, fabric, etc. to form a composite.

A reflector obtained by molding the polyamide composition for a reflector according to the present invention has good mechanical properties and high heat resistance. This reflector has appropriate surface roughness and excellent adhesion to a sealing material for an LED package. In addition, this reflector retains a high reflectance (in particular, a high reflectance for light with a wavelength of around 460 nm) even after exposure to heat and light intended for the production process of the LED package and the environment in which the reflector is used in the LED package. Moreover, the reflector has high thermal conductivity.

A reflector obtained by molding the polyamide composition for a reflector according to the present invention can be used for reflectors of various light sources, and in particular, it is suitably used as a reflector for an LED.

<Reflector for LED>

The reflector for an LED according to the present invention is a reflector for an LED, using the polyamide composition for a reflector according to the present invention. The reflector for an LED according to the present invention can be used suitably as a reflector for LEDs used in, for example, back light sources, lightings, and various automobile lamps. Particularly, it can be used suitably as a reflector for surface-mountable LEDs.

Preferably, the reflector for an LED according to the present invention has a reflectance of 85% or more for light with a wavelength of 460 nm when measured with a spectrophotometer after the reflector is irradiated with ultraviolet light for 24 hours.

The reflector for an LED according to the present invention can be used in a light emitting device, and the light emitting device has a longer life.

<Light Emitting Device>

So, the light emitting device according to the present invention is a light emitting device including the reflector for an LED according to the present invention. Examples of the light emitting device according to the present invention include back light sources, light sources for lightings, and light sources for various automobile lamps.

FIG. 1 shows an example of a typical configuration of the light emitting device according to the present invention. FIG. 1 illustrates schematically an SMD (surface mounted device) type light emitting device (LED device) 1. In the light emitting device 1, a light emitting element 10 is disposed in a package portion 50 formed of a substrate 20 and a reflector (housing) 30, and the package portion 50 is filled with a sealing material 40 (light transmissive resin).

Hereinafter, each component of the light emitting device according to the present invention is described. The components of the light emitting device according to the present invention are not limited to the following.

<Semiconductor Light Emitting Element>

As the semiconductor light emitting element 10, a semiconductor light emitting element having a light emission peak wavelength in a wavelength range of 500 nm or less can be used suitably. The semiconductor light emitting element 10 is not limited to a semiconductor light emitting element with a single light emission peak, and a semiconductor light emitting element with a plurality of light emission peaks also can be used. In the case where the semiconductor light emitting element has a plurality of light emission peaks, it may have one or a plurality of the light emission peaks in a wavelength range longer than 500 nm. Moreover, it also is possible to use a semiconductor light emitting element having a light emission peak in a long-wavelength range (501 nm to 780 nm) of visible light.

The configuration of the semiconductor light emitting element 10 is not particularly limited as long as it has the above-mentioned wavelength property. For example, it is possible to use a semiconductor light emitting element with a light emitting layer formed of a semiconductor such as GaAlN, ZnS, ZnSe, SiC, GaP, GaAlAs, AlN, InN, AlInGaP, InGaN, GaN or AlInGaN.

The light emitting layer may contain an arbitrary dopant.

A plurality of the semiconductor light emitting elements 10 can be used appropriately. For example, it is possible to use two light emitting elements capable of emitting green light, one light emitting element capable of emitting blue light, and one light emitting element capable of emitting red light.

The method for connecting the semiconductor light emitting element 10 to the substrate 20 is not particularly limited, and conductive epoxy or silicone adhesives can be used. In addition, a metal with a low melting point can be used in order to transfer effectively the heat generated from the semiconductor element to the substrate. Examples of the metal include Sn/Ag/Cu (with a melting point of 220° C.) and Sn/Au (with a melting point of 282° C.).

<Package>

The package is a member in which the semiconductor light emitting element 10 is mounted. The package, partly or entirely, is formed of the reflector for an LED according to the present invention.

In the present invention, the package may be composed of a single member or a plurality of members in combination.

Preferably, the package has a recessed portion (cup-shaped portion). As an example of the package, a package composed of a reflector (housing) and a substrate in combination can be mentioned. In FIG. 1, for example, the package has a configuration in which the reflector (housing) 30 with a desired shape is boned to the substrate 20 so as to form the recessed portion (cup-shaped portion) 50. The substrate 20 and the reflector 30 each are formed of the reflector for an LED according to the present invention obtained by molding the above-mentioned polyamide composition. Only one of the substrate 20 and the reflector 30 may be formed of the reflector for an LED according to the present invention. When a plurality of the reflectors for an LED according to the present invention are used as mentioned above, the reflectors for an LED with different properties obtained by molding the polyamide compositions having different compositions may be used in combination. As another example, there can be mentioned a configuration in which the above-mentioned polyamide composition is molded so as to form the recessed portion (cup-shaped portion) on one side so that the package is composed of a single reflector for an LED. As still another example, there can be mentioned a configuration in which the package is composed only of a platy reflector for an LED.

The recessed portion (cup-shaped portion) formed in the package refers to a portion that has a bottom part and a side part and is formed of a space with a shape that allows the area of a cross-section perpendicular to an optical axis to increase continuously or gradually from the bottom part toward the light emitting direction of the light emitting device. The shapes of the bottom part and the side part are not particularly limited as long as these conditions are satisfied.

<Sealing Material>

The sealing material 40 is formed so as to cover the semiconductor light emitting element 10. The sealing material 40 is provided mainly to protect the semiconductor light emitting element 10 from outside environment.

As the sealing material 40, a transparent thermosetting resin can be used to protect the semiconductor light emitting element 10 and wiring. Examples of the transparent thermosetting resin include a thermosetting resin containing epoxy or silicone. As the silicone, resin type, rubber type and gel type silicones can be used in accordance with the characteristics required for the package. In order to increase the adhesion between the reflector 30 and the sealing material 40, it is possible to treat the reflector 30 with plasma of rare gas such as argon.

The sealing material 40 can also be provided so that a plurality of layers made of different materials are laminated on the semiconductor light emitting element 10.

The sealing material 40 may contain a phosphor. The use of a phosphor makes it possible to convert a part of light emitted from the semiconductor light emitting element 10 into light with a different wavelength, and to change or correct the color of light emitted from the light emitting device.

As the phosphor, any phosphor can be used as long as it can be excited by the light emitted from the semiconductor light emitting element 10. For example, at least one selected from the following is used preferably: a nitride phosphor, an oxynitride phosphor and a sialon phosphor that are activated mainly by a lanthanoid element such as Eu and Ce; an alkaline earth metal aluminate phosphor, alkaline earth silicate, alkaline earth sulfide, alkaline earth thio gallate, alkaline earth silicon nitride and germinate that are activated mainly by a lanthanoid element such as Eu and a transition metal element such as Mn; rare earth aluminate and rare earth silicate that are activated mainly by a lanthanoid element such as Ce; and an organic compound and an organic complex that are activated mainly by a lanthanoid element such as Eu.

Moreover, the sealing material 40 can contain a plurality of phosphors in combination. In this case, it also is possible to use, in combination, a phosphor that emits light by being excited by the light from the semiconductor light emitting element 10 and a phosphor that emits light by being excited by the light from the phosphor.

It also is possible for the sealing material 40 to contain a light diffuser, such as titanium dioxide and zinc oxide, so as to accelerate the diffusion of light inside the sealing material 40 and reduce the unevenness in light emission.

The light emitting device 1 in FIG. 1 is produced as follows, for example. First, the reflector 30, which is the reflector for an LED according to the present invention, is disposed on the substrate 20, which is the reflector for an LED according to the present invention. Next, the semiconductor light emitting element 10 is mounted, and electrodes of the semiconductor light emitting element 10 are connected to a wiring pattern on the substrate 20 with leads. Subsequently, a liquid silicone sealing agent composed of a base and a curing agent is prepared and potted into the cup-shaped portion 50. The silicone sealing agent is heated in this state at about 150° C. to be thermally cured. Thereafter, the silicone sealing agent radiates heat into the air.

Figure 2:
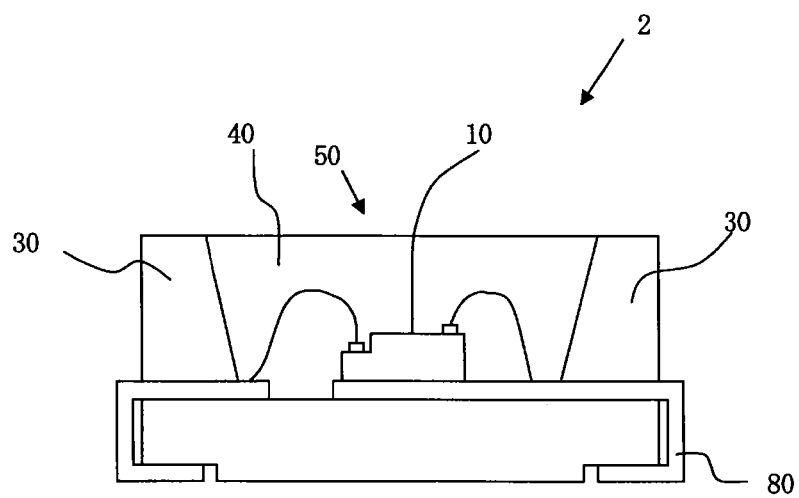
FIG. 2 is a diagram showing schematically the configuration of a light emitting device 2 according to the present invention.

FIG. 2 shows a schematic view of a light emitting device 2 according to the present invention, having a different configuration. In FIG. 2, the same components as those in the light emitting device 1 are indicated with the same reference numerals. In the light emitting device 2, a lead frame 80 is used instead of the substrate, and the semiconductor light emitting element 10 is mounted on the lead frame 80. The configuration is the same as that of the light emitting device 1 except for these.

Figure 3:
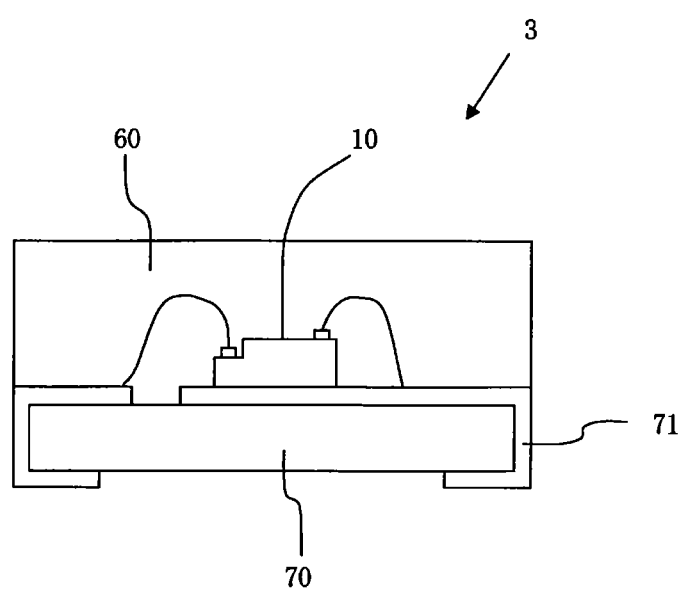
FIG. 3 is a diagram showing schematically the configuration of a light emitting device 3 according to the present invention.

FIG. 3 shows a schematic view of a light emitting device 3 according to the present invention, having another different configuration. In FIG. 3, the same components as those in the light emitting device 1 are indicated with the same reference numerals. In the light emitting device 3, a substrate 70 that is the reflector for an LED according to the present invention is used. The substrate 70 is provided with a desired wiring 71. No housing (reflector) is used, and as is illustrated, a sealing material 60 can be formed by molding with a desired mold after the semiconductor light emitting element 10 is mounted. Alternatively, it also is possible to prepare in advance the sealing material 60 molded into a desired shape and bond it to the substrate 70 so as to cover the semiconductor light emitting element 10.

Although the SMD type light emitting devices are described above as configuration examples of the present invention, the present invention can also be applied to a so-called lamp type light emitting diode in which a light emitting element is mounted on a lead frame having a cup-shaped portion, and the light emitting element and a part of the lead frame are covered with a sealing material. Moreover, the present invention can also be applied to a flip-chip type light emitting device in which a light emitting element is mounted, in the form of a so-called flip chip, on a substrate or a lead frame.

<Lighting Device>

The present invention is also a lighting device including the above-described light emitting device. The lighting device according to the present invention has a longer life because it uses the long-life light emitting device as described above. The lighting device according to the present invention can be configured according to a known method. For example, it can be configured by replacing a conventional light emitting device used as a light source for an LED lighting in a conventional LED lighting device by the above-described light emitting device.

<Image Display Device>

The present invention is also an image display device including the above-described light emitting device (for example, a small display of a mobile communication device such as a mobile phone or the like, a small display of a photographing equipment such as a digital camera, a digital video camera or the like, a small display of a car navigation system, a medium/large display of a personal computer, a liquid crystal TV or the like). The image display device according to the present invention has a longer life because it uses the long-life light emitting device as described above. The image display device according to the present invention can be configured according to a known method. For example, it can be configured by replacing a conventional light emitting device used as a light source for an LED back light in a conventional image display device by the above-described light emitting device.

EXAMPLES

Hereinafter, the present invention is described in more detail with reference to Examples and Comparative Examples. The present invention is not limited to these Examples.

In the following Examples and Comparative Examples, the limiting viscosity, melting point, reflectance, flexural strain at break, weld flexural strain at break, and surface roughness were evaluated as follows.

<Limiting Viscosity η>

Parts of each of polyamides described below were picked as samples. The intrinsic viscosities ($\eta_{inh}$) of the samples in concentrated sulfuric acid, with concentrations of 0.05 g/dl, 0.1 g/dl, 0.2 g/dl, and 0.4 g/dl, were measured at 30° C., and the viscosities thus measured were extrapolated to the concentration of 0 to obtain the limiting viscosity [η].

$$\eta_{inh} = [\ln(t_1/t_0)]/c$$

where $\eta_{inh}$ is the intrinsic viscosity (dl/g), to is the flow time (seconds) of a solvent, $t_1$ is the flow time (seconds) of a sample solution, and c is the concentration (g/dl) of the sample in the solution.

<Melting Point>

A part of each of the polyamides described below was picked as a sample, and about 10 mg thereof was heated from 30° C. to 360° C. at a rate of 10° C./minute in a nitrogen atmosphere using a differential scan calorimetric analyzer (DSC822) manufactured by METTLER-TOLEDO Inc., and the sample was maintained at 360° C. for 2 minutes to be melted completely. Then, the sample was cooled to 30° C. at a rate of 10° C./minute and maintained at 30° C. for 2 minutes. The peak temperature of the melting peak that appeared when the sample was heated again to 360° C. at the rate of 10° C./minute was defined as the melting point. In the case where a plurality of melting peaks were observed, the peak temperature of the melting peak on the highest temperature side was used as the melting point.

<Initial Reflectance>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 40 mm and a length of 100 mm. The reflectance of the specimen was measured at a wavelength of 460 nm using a spectrophotometer (U-4000) manufactured by HITACHI, Ltd.

<After-Heating Reflectance>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 40 mm and a length of 100 mm. This specimen was subjected to heat treatment at 170° C. for 2 hours in a hot air dryer. After the heat treatment, the reflectance of the specimen was measured at a wavelength of 460 nm using a spectrophotometer (U-4000) manufactured by HITACHI, Ltd.

<After Light Irradiation Reflectance>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 40 mm and a length of 100 mm. This specimen was placed at a distance of 25 cm from an upper quartz glass surface of a light resistance testing apparatus (SUPER WIN MINI, manufactured by DAIPLA WINTES Co., Ltd.) having a KF-1 filter (manufactured by DAIPLA WINTES Co., Ltd.), and the specimen was irradiated with light for 24 hours. The light had an illuminance of 10 mW/cm$^2$ at a wavelength of 300 to 400 nm at the position where the specimen was placed. The specimen that had been irradiated with the light was measured for reflectance at a wavelength of 460 nm by a spectrophotometer (U-4000) manufactured by HITACHI, Ltd.

<Flexural Strain at Break and Weld Flexural Strain at Break>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 10 mm and a length of 30 mm. The flexural strain at break and weld flexural strain at break of this specimen were measured at 23° C. using Autograph manufactured by Shimadzu Corporation.

<Surface Roughness>

The polyamide composition obtained in each of the Examples and Comparative Examples was injection-molded (with the temperature of the mold being 140° C.) at a cylinder temperature that was about 20° C. higher than the melting point of polyamide to produce a specimen with a thickness of 1 mm, a width of 10 mm and a length of 30 mm. The surface roughness of this specimen was measured by a surface roughness meter manufactured by Kosaka Laboratory Ltd. This surface roughness is a measure of adhesion between the sealing material and the substrate. For example, in an SMD type light emitting device shown as a configuration example of the present invention, it is considered that the most suitable height of the irregularities on the reflector surface is in the range of 50 nm to 500 μm when a silicone resin is used as a sealing agent. When the surface has no irregularities, the silicone resin cannot flow into the irregularities and is not anchored to the reflector surface, resulting in a decrease in the adhesion to the reflector. When the surface irregularities are too large, the silicone resin flows deeply into the irregularities and cannot be sufficiently anchored to the substrate, resulting in a decrease in the adhesion to the substrate. Based on the measurement results, the roughness evaluated as "good" and the roughness evaluated as "too large" were shown as "○" and "x" in Table 1, respectively.

The following materials were used in Examples and Comparative Examples below.

[Polyamide (A)]

(Polyamide (a-1-i))

A polyamide prepared according to the method described in Example 1 of JP 07 (1995)-228689 A was used. This polyamide was composed of terephthalic acid units, 1,9-nonanediamine units and 2-methyl-1,8-octanediamine units (at a molar ratio of 1,9-nonanediamine units to 2-methyl-1,8-octanediamine units of 85:15) and had a limiting viscosity [η] of 0.9 dl/g (measured at 30° C. in concentrated sulfuric acid), a melting point of 306° C., and an end-capping ratio of 77% (end-capping agent:benzoic acid).

(Polyamide (a-1-ii))

4788.3 g (28.8 mol) of terephthalic acid, 5093.4 g (29.6 mol) of 1,10-decanediamine, 143.7 g (1.18 mol) of benzoic acid as the end-capping agent, 10 g of sodium hypophosphite monohydrate, and 2.5 L of distilled water were put into an autoclave with an internal volume of 40 L, and the atmosphere thereof was replaced by nitrogen. The internal temperature of the autoclave was raised to 200° C. over 2 hours. At this time, the pressure in the autoclave was increased to 2 MPa. Thereafter, the internal temperature was maintained at 230° C. for 2 hours, and the mixture was reacted while water vapor was discharged gradually and the pressure was maintained at 2 MPa. Subsequently, the pressure was lowered to 1.2 MPa over 30 minutes to obtain a prepolymer. The prepolymer was crushed to the size of 1 mm or less, and dried at 120° C. under reduced pressure for 12 hours. The resultant was subjected to solid-phase polymerization under the conditions of 240° C. and 13.3 Pa for 10 hours. Thus, a polyamide having a limiting viscosity [η] of 0.93 dl/g (measured at 30° C. in concentrated sulfuric acid) and a melting point of 315° C. was obtained and used.

(Polyamide (a-2))

5111.2 g (29.7 mol) of 1,4-cyclohexanedicarboxylic acid in which the cis:trans ratio was 70:30, 4117.6 g (26.0 mol) of 1,9-nonanediamine, 726.6 g (4.59 mol) of 2-methyl-1,8- octanediamine, 224.2 g (1.84 mol) of benzoic acid as the end-capping agent, 10 g of sodium hypophosphite monohydrate, and 2.5 L of distilled water were put into an autoclave with an internal volume of 40 L, and the atmosphere thereof was replaced by nitrogen. The internal temperature of the autoclave was raised to 200° C. over 2 hours. At this time, the pressure in the autoclave was increased to 2 MPa. Thereafter, the internal temperature was maintained at 215° C. for 2 hours, and the mixture was reacted while water vapor was discharged gradually and the pressure was maintained at 2 MPa. Subsequently, the pressure was lowered to 1.2 MPa over 30 minutes to obtain a prepolymer. The prepolymer was crushed to the size of 1 mm or less, and dried at 120° C. under reduced pressure for 12 hours. The resultant was subjected to solid-phase polymerization under the conditions of 230° C. and 13.3 Pa for 10 hours. Thus, a polyamide containing 4.3 mol % of end-capping agent units and having a limiting viscosity [η] of 0.87 dl/g (measured at 30° C. in concentrated sulfuric acid) and a melting point of 315° C. was obtained and used.

In the production of the polyamides (a-1-i), (a-1-ii) and (a-2), each of the prepolymers was crushed to make sure that 75 to 90 mass % of the crushed prepolymer passed through a sieve with a mesh size of 710 μm before it was subjected to solid-phase polymerization.

[Titanium Oxide (B)]
"TIPAQUE CR-90" (titanium dioxide with an average particle diameter of 0.25 μm) manufactured by ISHIHARA SANGYO KAISHA, Ltd.

[Reinforcement Material (C)]
"CS3J256" (glass fiber: GF) manufactured by NITTO BOSEKI Co., Ltd.
"SH-1250" (wollastonite: WS) manufactured by KINSEI MATEC, Co., Ltd.

[Light Stabilizer (D)]
"Nylostab S-EED" (2-ethyl-2-ethoxy-oxalanilide) manufactured by CLARIANT (JAPAN) K.K.

[Magnesium Oxide (E)]
"MF-150" (magnesium oxide with an average particle diameter of 0.71 μm) manufactured by KYOWA CHEMICAL INDUSTRY Co., Ltd.

Examples 1 to 10 and Comparative Examples 1 to 3

The polyamide (A), the titanium oxide (B), the reinforcement material (C), the light stabilizer (D), the magnesium oxide (E) and the mold release agent were dry-blended in the amounts shown in Table 1 using a separating sieve. The resulting mixtures were each melt-kneaded in a twin screw extruder at a temperature 20° C. higher than the melting point of the polyamide used and extruded into pellets. Thus, polyamide compositions were prepared. Specimens with a specified shape were produced from the polyamide compositions thus prepared, respectively, in accordance with the above-mentioned method, and the specimens were evaluated for various physical properties. Table 1 shows the results.

TABLE 1

|  |  |  | Ex. 1 | Ex. 2 | Ex. 3 | Ex. 4 | Ex. 5 | Ex. 6 | Ex. 7 |
|---|---|---|---|---|---|---|---|---|---|
| Blended amounts (parts by mass) | Polyamide A | (a-1-i) | 57.6 | 67.5 | 37.7 | 47.7 | 52.6 | — | — |
|  |  | (a-1-ii) | — | — | — | — | — | 47.7 | 47.6 |
|  |  | (a-2) | — | — | — | — | — | — | — |
|  | Titanium oxide B |  | 39.6 | 29.7 | 59.5 | 39.6 | 29.7 | 39.6 | 49.6 |
|  | Reinforcement material C | Glass fiber | — | — | — | — | 14.9 | 9.9 | — |
|  |  | Wollastonite | — | — | — | 9.9 | — | — | — |
|  | Light stabilizer D |  | 0.3 | 0.3 | 0.3 | 0.3 | 0.3 | 0.3 | 0.3 |
|  | Magnesium oxide E |  | 2.0 | 2.0 | 2.0 | 2.0 | 2.0 | 2.0 | 2.0 |
|  | Mold release agent |  | 0.5 | 0.5 | 0.5 | 0.5 | 0.5 | 0.5 | 0.5 |
| Measurement and evaluation | Reflectance | After molding (%) | 98% | 98% | 98% | 98% | 97% | 96% | 97% |
|  |  | After heat treatment (%) | 97% | 97% | 96% | 96% | 96% | 95% | 95% |
|  |  | After light irradiation (%) | 91% | 87% | 94% | 97% | 82% | 89% | 91% |
|  | Mechanical properties | Flexural strain at break (%) | 3.20% | 3.50% | 1.90% | 2.30% | 2.00% | 2.00% | 2.60% |
|  |  | Weld flexural strain at break (%) | 2.40% | 3.20% | 1.60% | 1.50% | 1.40% | 1.60% | 2.20% |
|  | Surface roughness |  | ○ | ○ | ○ | ○ | ○ | ○ | ○ |

|  |  |  | Ex. 8 | Ex. 9 | Ex. 10 | Com. Ex. 1 | Com. Ex. 2 | Com. Ex. 3 |
|---|---|---|---|---|---|---|---|---|
| Blended amounts (parts by mass) | Polyamide A | (a-1-i) | — | — | — | 77.4 | 23.9 | 57.6 |
|  |  | (a-1-ii) | — | — | — | — | — | — |
|  |  | (a-2) | 47.7 | 47.6 | 54.8 | — | — | — |
|  | Titanium oxide B |  | 39.6 | 49.6 | 37.5 | 19.8 | 73.3 | 19.8 |
|  | Reinforcement material C | Glass fiber | 9.9 | — | — | — | — | — |
|  |  | Wollastonite | — | — | 4.9 | — | — | 19.8 |
|  | Light stabilizer D |  | 0.3 | 0.3 | 0.3 | 0.3 | 0.3 | 0.3 |
|  | Magnesium oxide E |  | 2.0 | 2.0 | 2.0 | 2.0 | 2.0 | 2.0 |

TABLE 1-continued

|  |  |  |  |  |  |  |  |  |
|---|---|---|---|---|---|---|---|---|
|  | Mold release agent |  | 0.5 | 0.5 | 0.5 | 0.5 | 0.5 | 0.5 |
| Measurement and evaluation | Reflectance | After molding (%) | 97% | 98% | 98% | 98% | 96% | 97% |
|  |  | After heat treatment (%) | 95% | 96% | 96% | 96% | 94% | 95% |
|  |  | After light irradiation (%) | 96% | 97% | 96% | 79% | 95% | 83% |
|  | Mechanical properties | Flexural strain at break (%) | 2.00% | 2.30% | 2.60% | 4.30% | 0.80% | 2.00% |
|  |  | Weld flexural strain at break (%) | 1.50% | 1.80% | 2.00% | 3.30% | 0.70% | 1.30% |
|  | Surface roughness |  | ○ | ○ | ○ | ○ | x | x |

As shown in Table 1, the polyamide compositions for reflectors in Examples each retain a reflectance of 95% or more at a wavelength of 460 nm even after exposure to high-temperature heating treatment intended for an LED production process, and also retain a reflectance of 80% or more at a wavelength of 460 nm even after exposure to light irradiation treatment intended for actual lighting of an LED. Thus, they have highly retainable reflective properties, and further have surface properties suitable for the sealing process for packaging and mechanical strength. As a result, the resulting reflector is suitable for the LED package production process and the environment in which it is used in the LED package, and allows a light emitting device including the reflector, and a lighting device and an image display device each including the light emitting device to have longer lives.

The polyamide compositions of Example 1 and Comparative Example 1 were molded into reflectors, and light emitting devices were produced using these reflectors. The light emitting devices were evaluated for the luminous intensity retention rates. Table 2 shows the evaluation results. The light emitting devices used for the evaluation and the method for measuring their luminous intensity retention rates are as follows.

Example 11

The light emitting device had the configuration of the SMD type light emitting device 1 shown in FIG. 1. As the light emitting element 10, a blue light emitting element having a light emission peak wavelength of 460 nm was used. As the sealing material 40, silicone (product name KER2500 manufactured by SHIN-ETSU CHEMICALS Co., Ltd.) was used. As the reflector 30, an in-house-made reflector with size 3228 was used.

The polyamide composition of Example 1 was used as a material for the reflector 30 in Example 11. The sealing material contained a YAG phosphor represented by $(Y,Ga)_3Al_5O_{12}$:Ce.

Comparative Example 4

In Comparative Example 4, the material of the reflector 30 was changed to the polyamide composition of Comparative Example 1, and the SMD type light emitting device shown in FIG. 1 was produced as in Example 11.

<Method for Measuring Luminous Intensity Retention Rate>

The light emitting devices of Example 11 and Comparative Example 4 were each subjected to a power-on test at 85° C. and 15 mA for 1000 hours, and the luminous intensity after 1000 hours with respect to the luminous intensity at 0 hours was determined to measure the luminous intensity retention rate (the luminous intensity after 1000 hours/the luminous intensity at 0 hours). For each of Example 11 and Comparative Example 4, 150 light emitting devices were measured for the luminous intensities, and the average value thereof was defined as the luminous intensity of each of Example 11 and Comparative Example 4.

TABLE 2

| Light emitting device | Example 11 | Comparative Example 4 |
|---|---|---|
| Polyamide composition | Example 1 | Comparative Example 1 |
| Luminous intensity retention rate (%) | 95 | 85 |

As is apparent from Table 2, it was confirmed that the light emitting device (Example 11) including the reflector for an LED produced from the polyamide composition of Example 1 corresponding to the polyamide composition according to the present invention had a high luminous intensity retention rate.

INDUSTRIAL APPLICABILITY

Since reflectors using the polyamide composition for a reflector according to the present invention retain high reflectances even after exposure to heat and light, they can be suitably used as components having a light reflecting function, for example, reflectors for LEDs, light sources for projectors, lighting equipment and automobile headlamps. Particularly, they can be suitably used as reflectors for surface-mountable LEDs.

The invention claimed is:
1. A polyamide composition for a reflector, comprising:
37.7 mass % or more to less than 67.5 mass % of a polyamide (A) having a melting point of 280° C. or higher;
more than 30 mass % to 59.5 mass % or less of titanium oxide (B);
15 mass % or less of a reinforcement material (C);
optionally 2 mass % or less of a light stabilizer; and
optionally magnesium oxide and/or magnesium hydroxide,
wherein a total content of the polyamide (A) and the titanium oxide (B) is 80 mass % or more,
wherein a content of components except for the polyamide (A), the titanium oxide (B), the reinforcement material (C), the light stabilizer, magnesium oxide and magnesium hydroxide is 5 mass % or less, wherein the composition is obtained using 50 mass % or more of the polyamide (A) in the form of solids having a particle diameter in a range of 1 mm or less, wherein the polyamide (A) comprises units derived from an end-capping agent and the content of the units derived from the end-capping agent is from 1 to 10 mol % with respect to the diamine units, wherein dicarboxylic acid units of the polyamide (A) comprise 50 mol % or more of terephthalic acid units, wherein diamine units of the polyamide (A) comprise 50 mol % or more of 1,9-nonanediamine units and/or 2-methyl-1,8-octanediamine units, wherein the titanium oxide (B) is titanium dioxide, and wherein the reinforcement material (C) is present and the reinforcement material (C) consists of glass fiber and/or wollastonite.

2. The polyamide composition of claim 1, wherein the content of the reinforcement material (C) is 10 mass % or less.

3. The polyamide composition of claim 1, wherein the magnesium oxide and/or magnesium hydroxide is present.

4. The polyamide composition of claim 1, wherein the content of the units derived from the end-capping agent is from 3.5 to 8.5 mol % with respect to the diamine units.

5. The polyamide composition of claim 1, wherein the end capping agent is a monocarboxylic acid.

6. The polyamide composition of claim 1, wherein the end capping agent is a monoamine.

7. The polyamide composition of claim 1, wherein the content of components except for the polyamide (A), the titanium oxide (B), the reinforcement material (C), the light stabilizer, magnesium oxide and magnesium hydroxide is 0.5 mass % or less.

8. The polyamide composition of claim 7, wherein the light stabilizer and at least one selected from the group consisting of magnesium oxide and magnesium hydroxide are present.

9. The polyamide composition of claim 1, which does not comprise potassium titanate.

10. A reflector for an LED, comprising the polyamide composition of claim 1.

11. The reflector of claim 10, wherein the reflector has a reflectance of 85% or more for light with a wavelength of 460 tam when measured with a spectrophotometer after the reflector is irradiated with ultraviolet light for 24 hours.

12. A light emitting device, comprising the reflector of claim 10.

13. A lighting device, comprising the light emitting device of claim 12.

14. An image display device, comprising the light emitting device of claim 12.

* * * * *